United States Patent [19]

Shimoji

[11] Patent Number: 5,463,579
[45] Date of Patent: Oct. 31, 1995

[54] SEMICONDUCTOR MEMORY DEVICE WITH FLOATING GATE AND METHOD FOR DRIVING THE SAME

[75] Inventor: Noriyuki Shimoji, Kyoto, Japan

[73] Assignee: Rohm Co., Ltd., Kyoto, Japan

[21] Appl. No.: 401,306

[22] Filed: Mar. 9, 1995

Related U.S. Application Data

[63] Continuation of Ser. No. 161,426, Dec. 6, 1993, abandoned.

[30] Foreign Application Priority Data

Dec. 25, 1992 [JP] Japan ................................. 4-347108

[51] Int. Cl.⁶ .................................................. G11C 11/34
[52] U.S. Cl. ................... 365/185.01; 327/316; 327/317; 327/318
[58] Field of Search ................................. 365/185, 184, 365/104; 257/316, 317, 318, 320, 321

[56] References Cited

U.S. PATENT DOCUMENTS

| | | | |
|---|---|---|---|
| 4,328,565 | 5/1982 | Harari | 365/185 |
| 4,361,847 | 11/1982 | Harari | 365/185 |
| 4,639,893 | 1/1987 | Eitan | 365/185 |
| 4,939,558 | 7/1990 | Smayling et al. | 257/316 |
| 5,045,488 | 9/1991 | Yeh | 365/185 |
| 5,317,179 | 5/1994 | Chen et al. | 257/316 |

OTHER PUBLICATIONS

An Asymmetrical Lightly–Doped Source (ALDS) Cell For Virtual ground High Density EPROMs, IEEM, 1988, pp. 432–435.
A Novel Memory Cell Using Flash Array Contactless EPROM (FACE) Technology, IEDM 1990, pp. 91–94.

*Primary Examiner*—David C. Nelms
*Assistant Examiner*—Vu A. Le
*Attorney, Agent, or Firm*—Nikaido, Marmelstein, Murray & Oram

[57] ABSTRACT

A virtual ground array semiconductor memory device includes a matrix of memory cells, which performs writing and erasing operations utilizing FN current, reduces the electric power consumption and the deterioration of a tunnel insulating film. Each memory cell has a floating gate on one side of a channel region and a control gate covering the floating gate and the other side of the channel region.

3 Claims, 7 Drawing Sheets

SEMICONDUCTOR MEMORY DEVICE WITH FLOATING GATE AND METHOD FOR DRIVING THE SAME

This application is a continuation of application Ser. No. 08/161,426, filed Dec. 6, 1993 now abandoned.

FILED THE INVENTION

The present invention relates to semiconductor memory device and a method for driving the same. More particularly, it relates to a virtual ground array semiconductor memory device of the structure wherein memory cells are arranged in a matrix and the drain of each memory cell is connected to the source of an adjacent memory cell to form a bit line, and to a method therefor wherein writing and erasing are both achieved by using Fowler-Nordheim (FN) current thereby saving the electric power and avoiding deterioration of a tunnel insulating film.

BACKGROUND OF THE INVENTION

There are widely used EEPROMs capable of being rewritten electrically and maintaining stored data even when the power is off. The EEPROMS are classified into two types; one flash memory type wherein hot electrons are injected to a floating gate, the other is an MONOS (metal oxide nitride oxide semiconductor) or MNOS (metal nitride oxide semiconductor) type wherein electrons are inejcted to an insulating film through FN tunneling or direct tunneling.

On the other side, there have been reported virtual ground array semiconductor memory devices of the flash memory type wherein memory transistors are arranged in an array of which drains and sources are connected between adjacent transistors with no provision of contacts to both of the source and the drain for the small device size. Such memory devices have been disclosed in, for example "A Novel Memory Cell Using Flash Array Contactless EPROM-(FACE) Technology", IEDM 1990, pp, 9–94 and "An Asymmetrical Lightly-Dopes Source(ALDS) Cell for Virtual Ground High Density EPROMs", IEEM, 1988, pp. 432–435.

FIG. 6 is an explanatory section showing a portion of one cell of a conventional virtual ground array semiconductor memory device. FIG. 7 illustrates a drive method for this memory device and wherein FIG. 7(a) is an explanatory view illustrating a write mode and FIG. 7(b) is an explanatory view illustrating an erase mode.

The memory cell of the semiconductor memory device shown in FIG. 6 comprises a source region 2, a drain region 3, and a channel region 4 defined between the source region 2 and the drain region 3, these regions 2, 3 and 4 being provided in a semiconductor substrate 1. Further, the memory cell comprises tunnel insulating film 5, floating gate 6, interlayer insulating film 7, and control gate 8, these components being sequentially stacked on the channel region 4.

As shown in FIG. 7(a), in the write mode, a high potential $V_{pp}$ of about 12 V is applied to the control gate 8 and a high potential $V_d$ of about 6 V to the drain region 3 so that current flow in the device to inject hot electrons to the floating gate 6.

As shown in FIG. 7(b), in the erase mode, a high potential $V_s$ of about 12 V is applied to the source region 2 with the potential of the control gate 8 set at 0 V, so that Fowler-Nordheim (FN) current produced thereby withdraw electrons from the floating gate.

As described above, the conventional virtual ground array semiconductor memory employs a flash-type memory transistor having a floating gate to write on and to read out of. In the flash-type memory transistor, however, since hot electrons are injected with high energy, the trap density of electrons or holes in the oxide film and, increases and, thereby the potential distribution in the oxide film is changed. Consequently, reinjection with positive feedback increases, which may result in destruction of the oxide film.

Further, since drain current is only partially injected to the floating gate, the writing with hot electrons is not efficient, and need a large electric current to be consumed.

SUMMARY OF THE INVENTION

In view of the foregoing problems, it is an object of the present invention to provide a semiconductor memory device of reduced power consumption and improved reliability with less deterioration of tunnel insulating film, and to provide a drive method therefor.

According to one aspect of the present invention, there is provided a semiconductor memory device comprising a semiconductor substrate, and memory cells arranged in a matrix array on the semiconductor substrate, each of the memory cells comprising:

a drain region formed in the semiconductor substrate, a source region formed in the semiconductor substrate, a channel region defined between the drain region and the source region, a tunnel insulating film formed on the channel region of the substrate, a floating gate formed on the tunnel insulating film, an interlayer insulating film formed on the floating gate, and a control gate formed on the interlayer insulating film, wherein the drain region of each memory cell is connected to or is in common with the source region of a memory cell existing adjacent thereto; the floating gate covers a portion of the channel region; and the control gate is formed in a step such that a portion of the control gate covers one side of the channel region which is close to the drain region or the source region with intervention of a gate insulating film while the remaining portion of the control gate covers the top and a lateral surface of the floating gate with intervention of the interlayer insulating film.

Preferably, at least the source region or the drain region whichever the closer the the floating gate is comprised of a dual impurity concentration region having a lightly doped region surrounding outside.

Another aspect of the present invention provides a method for driving the above-mentioned semiconductor memory device, comprising the steps of:

(a) applying to the control gate an electric potential higher than that of the semiconductor substrate to inject electrons from the channel region to the floating gate in the erase mode; and (b) applying to the source or the drain region whichever is closer to the floating gate an electric potential higher than that of the control gate to withdraw electrons from the floating gate in the write mode.

In the virtual ground array semiconductor memory device according to the present invention, a portion of the control gate covers one side of the channel region close to the drain or source region with intervention of the gate insulating film and without intervention of the floating gate. Hence, a relatively high potential applied to a bit line connecting the portions connecting the sources and drains moves electrons between the substrate and the floating gate in the cell of which the floating gate instead of the control gate is closer to the bit line, and do not move electrons in the cell of which the control instead of the floating gate is closer to the bit line, and only a desired cell can be selectively written on.

Further, since a portion of the control gate covers the channel portion with intervention of the gate insulating film free of the floating gate, even if too many electrons are withdrawn, a problem will not occur that the transistor responds to a low gate voltage (or the transistor becomes a depletion-type).

Further, either of the source or the drain region which is closer to the floating gate is formed of a dual impurity concentration region having a lightly doped region surrounding outside so that the deterioration of the capability to withstand voltage gap against the substrate such as junction leakage or breakdown can be prevented. As for the method for driving the memory device of the present invention, in the erase mode electrons are injected to the floating gates while in the write mode electrons are withdrawn from the floating gates, that is, both of these modes are based on FN current induced by voltage applied across the cell, not on the injection of hot electrons having a high energy. Accordingly, there is no need to use wastefull current, and this leads to a reduction in electric power to be consumed with less deterioration of the tunnel insulating film.

BRIEF EXPLANATION OF THE DRAWINGS

FIG. 4 generally illustrates a drive method for the semiconductor memory device according to the present invention, in which

FIG. 7 generally illustrates a drive method for the semiconductor memory device shown in FIG. 6, in which

DETAILED DESCRIPTION

The present invention will now be described in detail with reference to the drawings.

Figure 1:
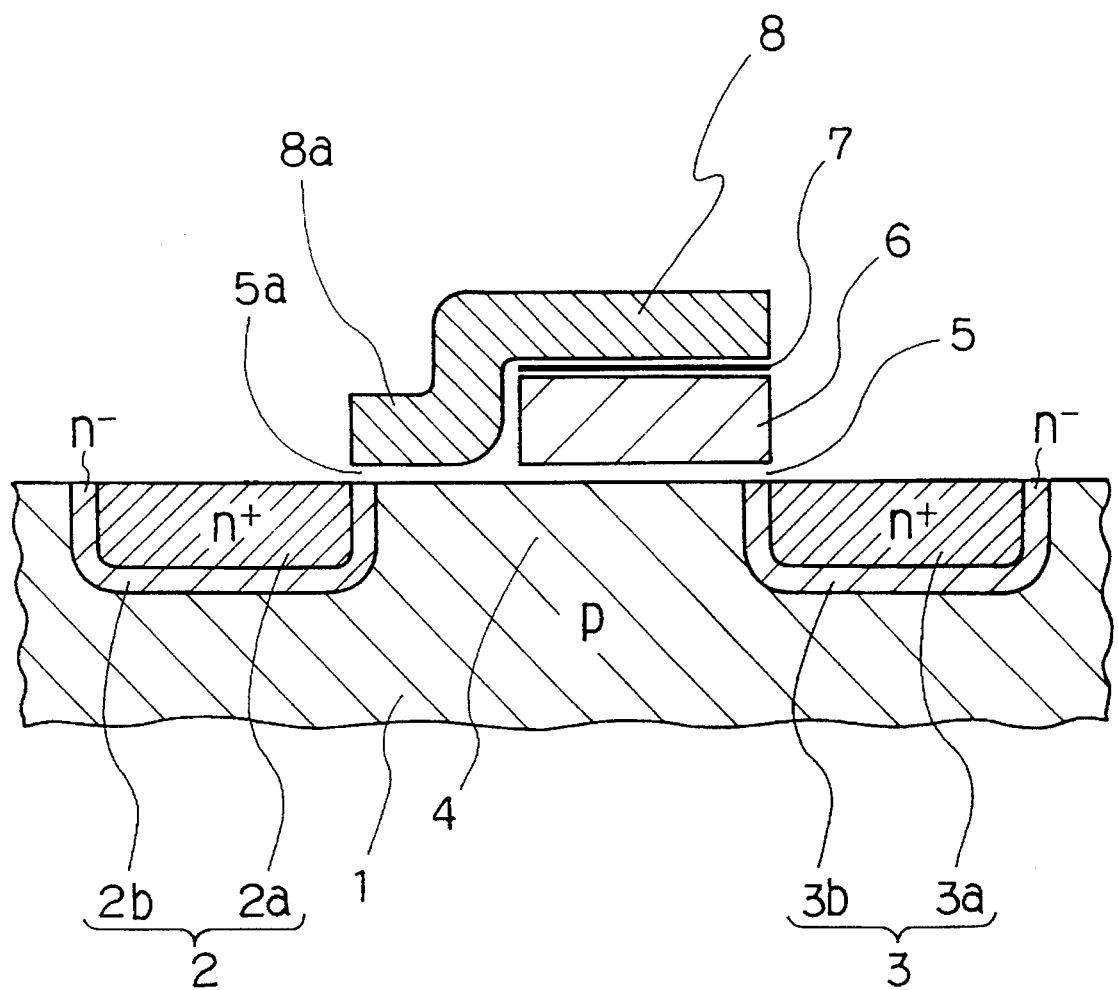
FIG. 1 is an explanatory section showing one cell of the semiconductor memory device according to the present invention.
Figure 2:
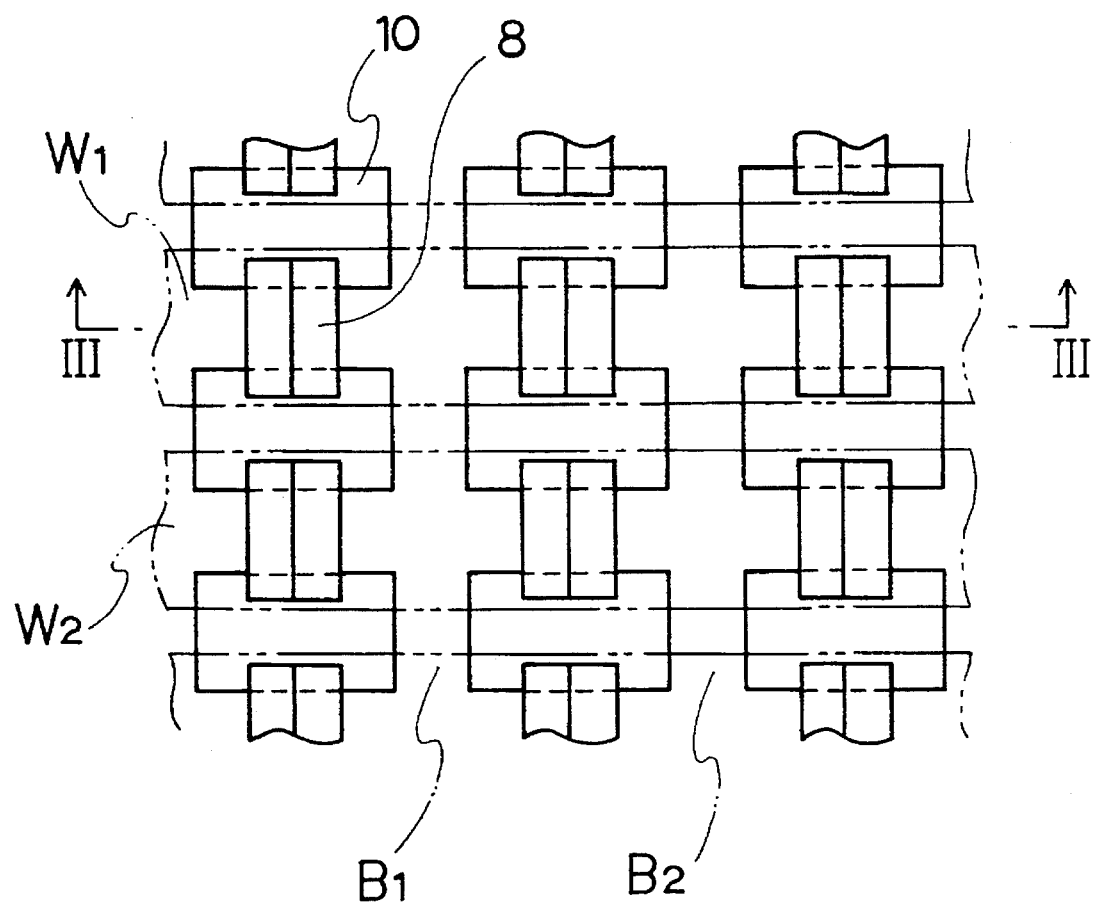
FIG. 2 is an explanatory plan view showing one embodiment of the semiconductor memory device according to the present invention.
Figure 3:
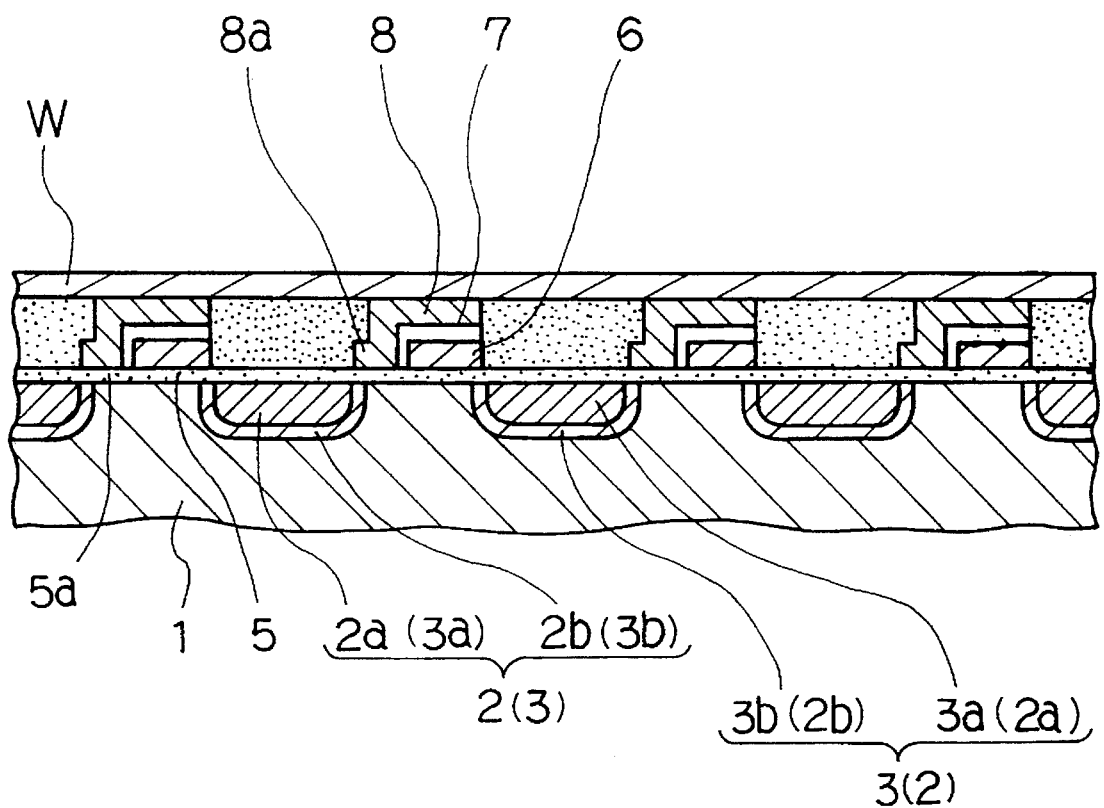
FIG. 3 is a sectional view taken along line III—III of FIG. 2.

Referring to FIGS. 1 to 3, in a semiconductor substrate 1 (of p-type, for example), a source region 2 is formed of a dual diffusion region comprising an $n^+$-type relatively high impurity concentration region 2a and an $n^-$-type relatively low impurity concentration region 2b surrounding the high concentration region 2a, and in the same way a drain region 3 is formed of a dual diffusion layer comprising an $n^+$-type high concentration region 3a and an $n^-$-type low concentration region 3b, and a channel region 4 is a defined intermediately between the source region 2 and the drain region 3.

A tunnel insulating film 5 such as made of oxide film or nitride film is formed on the semiconductor substrate 1, and a gate insulating film 5a is formed on one side of the channel region which is close to the drain region 3 or the source region 2. (In the present embodiment the gate insulating film 5 is formed on the side to the source region 2). On the region covered with the gate insulating film 5a is formed a portion 8a of a control gate 8. On the tunnel insulating film 5 are formed a floating gate 6 formed of a first polysilicon layer, an interlayer insulating film 7 composed of ONO three-layered structure having silicon oxide film, silicon nitride film and silicon oxide film, and the control gate 8 formed of a second polysilicon layer. An end face of the floating gate 6 is aligned with an interface between the low concentration region 3b and the high concentration region 3a. The control gate 8 extends along a lateral surface control gate of the floating gate 6 to the aforementioned portion 8a on the gate insulating film 5a forming a shape of a step.

By thus providing the gate insulating film 5a and the portion 8a of the control gate 8 on one side of the channel region which is close to either of the source region 2 or the drain region 3, in two adjacent cells of the cells arranged in a matrix electrons are withdrawn from the floating gate only in one cell of which the floating gate is closer to the intermediate source 2 or drain 3 region than that of the other cell without the electrons being withdrawn from the floating gate in the other cell of which the gate insulating film 5 is closer to the intermediate source 2 or drain 3 region than that of the counterpart cell. Therefore, only a desired cell can be selectively written. Further, the portion of a cell in which the portion 8a of the control gate 8 is provided on the channel region 4 with intervention of the gate insulating film 5a operates as a common MOS transistor, which prevents the cell from becoming a depletion-type transistor even if too many electrons are withdrawn from its floating gate, thereby avoids malfunction.

To manufacture this semiconductor memory device, a field insulating film 10 is first formed on the semiconductor substrate 1 by an oxidation process or a like process as shown in the plan view of FIG. 2. In turn, as shown in the sectional views of FIGS. 1 and 3, the tunnel insulating film 5 made of silicon oxide or the like is formed on an active region of the substrate 1 to have a thickness of 60 to 150 Å (for example, 100 Å) by an oxidation process, CVD process or a like process.

Next, an intended floating gate in the form of, for example, a first polysilicon is deposited to 1000 to 2000 Å thickness by, for example, a CVD process, and then an intended interlayer insulating film in the form of an insulating film of ONO three-layered structure comprising silicon oxide, silicon nitride and silicon oxide is deposited to have a total thickness of 200 to 300 Å also by the CVD process or a like process. The intended interlayer insulating film 7 and intended floating gate are patterned by etching while removing the tunnel insulating film 5 on the channel region (on the side close to the source region in this embodiment). Next, the gate insulating film 5a is formed (on the region from which the tunnel insulating film has been removed) while at the same time an insulating film is formed on a lateral surface of the floating gate 6. A second polysilicon layer intended to be the control gate 8 is deposited to have a thickness of 3000 to 4000 Å and then patterned by etching to define the floating gate 6, interlayer insulating film 7 and control gate 8 in each memory cell. The ratio in length of the portion of the control gate which covers the channel region with intervention of the gate insulating film to the portion thereof covering the floating gate with intervention of the interlayer insulating film is preferably 1:1.

Then, respective low concentration regions 2b and 3b of the source and the drain regions are formed by implanting, for example, phosphorus ions at a dose of 5E13/cm$^2$ to 5E14/cm$^2$ and with an energy of 100 to 150 keV with use of the control gate 8 as a mask. The resulting low concentration regions 2b and 3b each have impurity concentration of 1E18/cm$^3$ to 1E19/cm$^3$. In the present embodiment the cell area is reduced by such an arrangement that the source region 2 of one memory cell is commonly used with the drain region 3 of the adjacent cell on the left side and that the drain region 3 of one memory cell is commonly used with the source region 2 of the adjacent cell on the right side. However, each memory may have its own source and drain regions. Thereafter, implantation of, for example, arsenic ions is performed at a dose of 1E15/cm$^2$ to 5E15/cm$^2$ and an energy of 50 to 100 keV with use of the control gate 8 as a mask to form respective high concentration regions 2a and 3a of the source and drain regions as having impurity concentration of about 1E20/cm$^3$. Further, the overall surface of the resulting structure is covered with an insulating film made of silicon oxide or the like, word lines $W_1$, $W_2$ . . . formed of polysilicon or silicide are formed to connect respective control gates of the cells arranged laterally, and bit lines $B_1$, $B_2$ . . . Bn of Al—Si or Al—Si—Cu (not shown in FIG. 3) are formed to have a thickness of about 7000 Å to connect respective source (drain) regions of the cells arranged lengthwise.

The reason why the interlayer insulating film between the floating gate 6 and the control gate 8 is of the ONO three-layered structure is to enhance the insulating property thereof. However, the interlayer insulating film may be of a single-layer or double layer structure. In the present embodiment the source and drain regions are each comprised of a dual diffusion layer having a high concentration region and a low concentration region. The provision of the low concentration region is for improving the withstand voltage characteristics. Although such a dual diffusion layer is preferable to improve the withstand voltage characteristics, the source and drain regions are each not necessarily of the dual diffusion layer. The low concentration region may be provided only to the region (drain region in the present embodiment) on the side without the gate insulating film 5a. This improves the capability withstanding a high voltage for writing because writing is effected only in the source region or drain region close to the floating gate. In the present embodiment respective low concentration regions of the source and drain regions are formed by implantation of phosphorus ions, while respective high concentration regions thereof by implantation of arsenic ions. The phosphorus impurities are preferable for the low concentration region because they are easy to diffuse into neighboring regions, and the arsenic impurities are preferable for the high concentration region because they are difficult to diffuse and, hence, advantageously keep the concentration high. However, these impurities are not limitative. In addition, although the n-type source and drain regions are formed in the p-type semiconductor substrate in the present embodiment, the conductivity type of each component may be reversed.

A drive method for the semiconductor memory device of the present invention will be explained.

A conventional flash memory having a floating gate is written by injecting hot electrons to the floating gate and erased by withdrawing electrons from the floating gate. In contrast, the present invention is characterized in that it is erased by injecting electrons to the floating gate and written by withdrawing electrons from the floating gate of individual cell; in other words, electrons are moved by FN current induced by a voltage applied across the two electrodes.

Figure 4A:
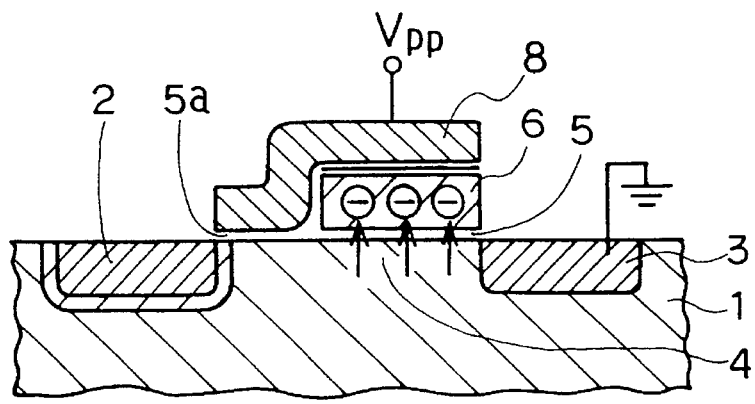
FIG. 4(a) is an explanatory view illustrating an erase mode.

To erase the stored data, as shown in FIG. 4(a), a voltage is applied so that the potential $V_{pp}$ of the control gate 8 is made higher than that of the semiconductor substrate 1 to inject electrons from the substrate 1 to the floating gate 6. For example, by applying 18 V to the control gate 8 with the source region 2, drain region 3 and substrate 1 being grounded (0 V) respectively FN current flows from the substrate 1 to the control gate 8 thereby injecting electrons to the floating gate 6 through the tunnel insulating film 5. Since the data are erased in one word line after another collectively, other word lines (control gates of memory cells in other rows) are set to be 0 V.

Figure 4B:
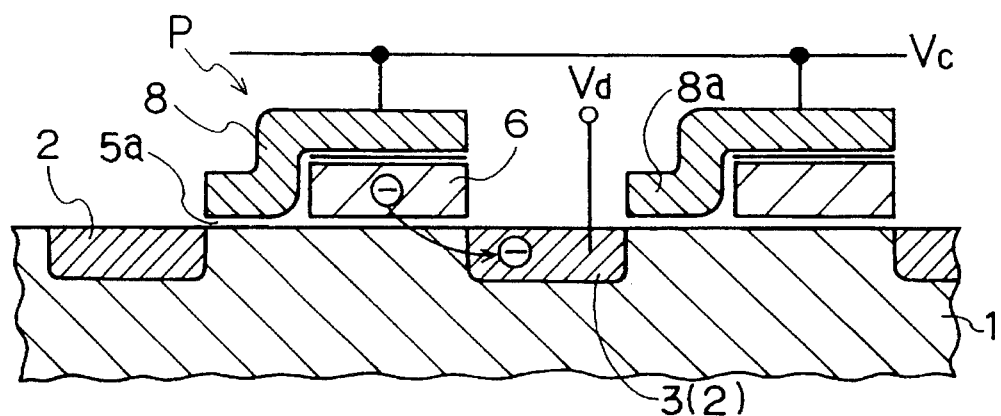
FIG. 4(b) is an explanatory view illustrating a write mode.

To write data, as shown in FIG. 4(b), a voltage is applied so that the potential $V_d$ of the drain region 3 is made higher than the potential $V_c$ of the control gate 8 to withdraw electrons from the floating gate 6 to the drain region 3. At this time the voltage $V_d$ applied to the drain region 3 is also applied to the source region. 2 of an adjacent cell (on the right side in FIG. 4(b)). However, only the tunnel insulating film 5 of the cell close to the floating gate (on the left side in FIG. 4(b)) allows tunneling of electrons because in the adjacent cell on the right side of which source region is connected to or commonly used with the drain region 3, the portion 8a of the control gate is provided adjacent to the drain region 3, so that the tunneling of electrons is prevented. Thus, writing only to a desired cell is achieved. Such a writing operation is performed by, for example, applying a voltage $V_d$ so that the potential of the drain region 3 of a selected cell $P_1$ is set to be a high potential of about 12 V with the control gate 8 of the selected cell $P_1$ being grounded. As a result electrons are withdrawn from the floating gate 6. At this time control gates of non-selected cells existing in the same column with the selected cell $P_1$ and in other rows are applied with a write-prohibiting potential $V_i$ of about 6 V so as to prevent writing thereto.

The way of applying a potential for writing is not limited to the above-mentioned, the drain region 3 may be applied with a relatively low potential of about 6 V by applying a negative potential of about −6 V to the control gate instead of grounding the control gate. As a result the potential difference between the drain region 3 and the substrate 1 is decreased, which contributes to a reduction in leakage current and an improvement in withstand voltage characteristics.

Figure 4C:
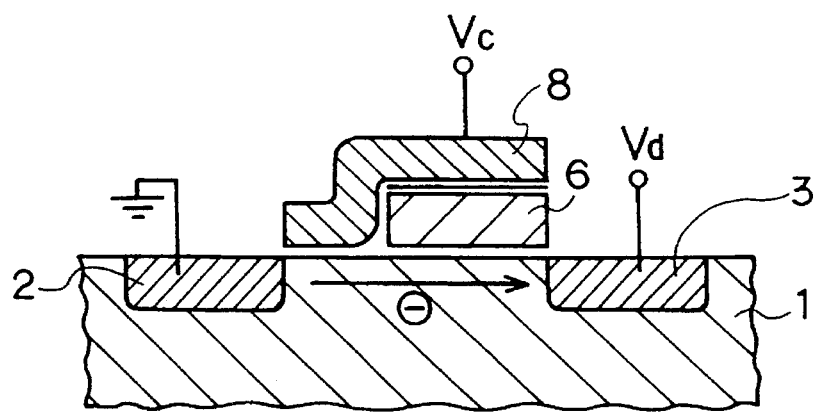
FIG. 4(c) is an explanatory view illustrating a read mode.

In reading, as shown in FIG. 4(c), when the potential $V_c$ of the control gate 8 and the potential $V_d$ 0f the drain region 3 are set to about 5 V and to about 1 V, respectively with the source region 2 being grounded, current does not flow between the source region 2 and the drain region 3 if the cell is in the erased state in which the floating gate 6 holds electrons injected so that the threshold voltage is relatively high; alternatively, current flows between the source region 2 and the drain region 3 if the cell is in the written state in which electrons have been withdrawn from floating gate 6 so that the threshold voltage is relatively low. Therefore, by determining whether or not current flows, the storage state, "1" or "0", can be read.

Figure 5:
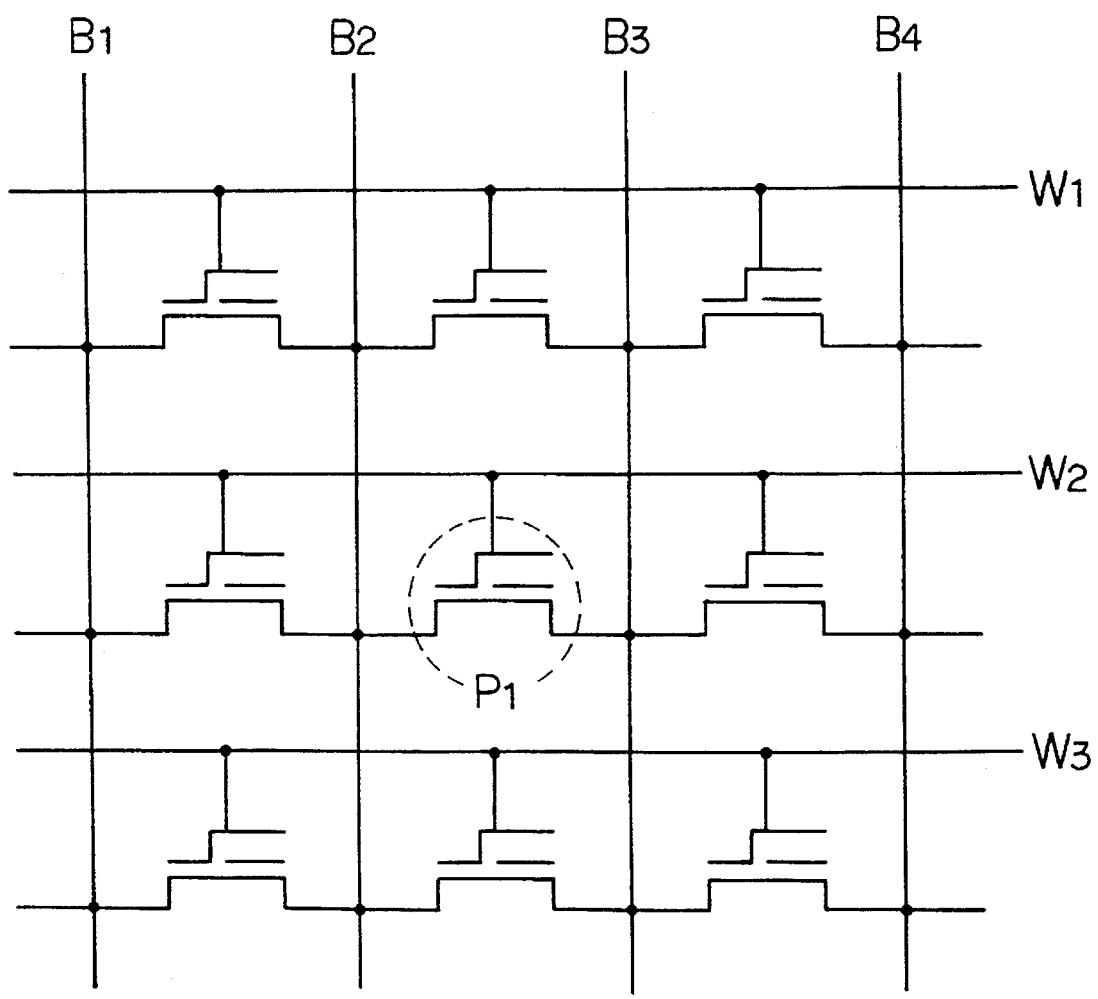
FIG. 5 is an equivalent circuit diagram of a virtual ground array semiconductor memory device in which memory transistors each having a floating gate are arranged in a matrix fashion.
Figure 6:
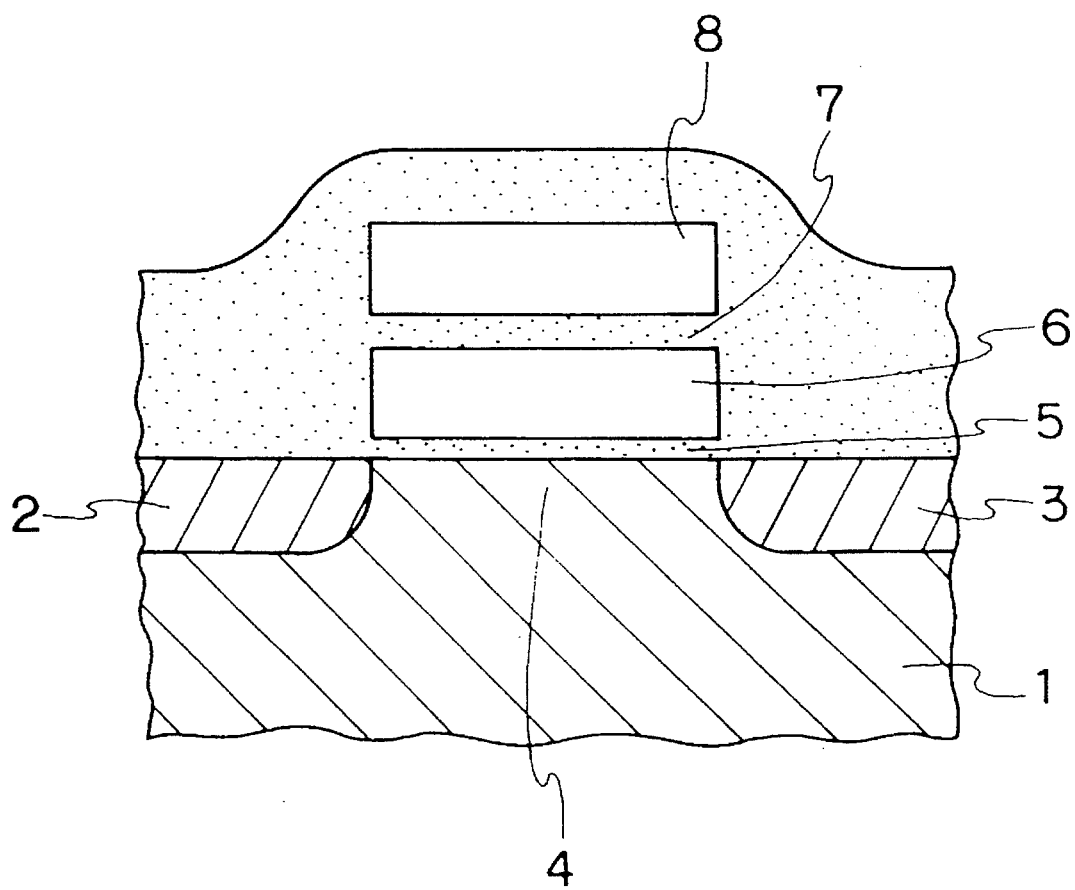
FIG. 6 is an explanatory section shown one cell of a prior art semiconductor memory device.
Figure 7A:
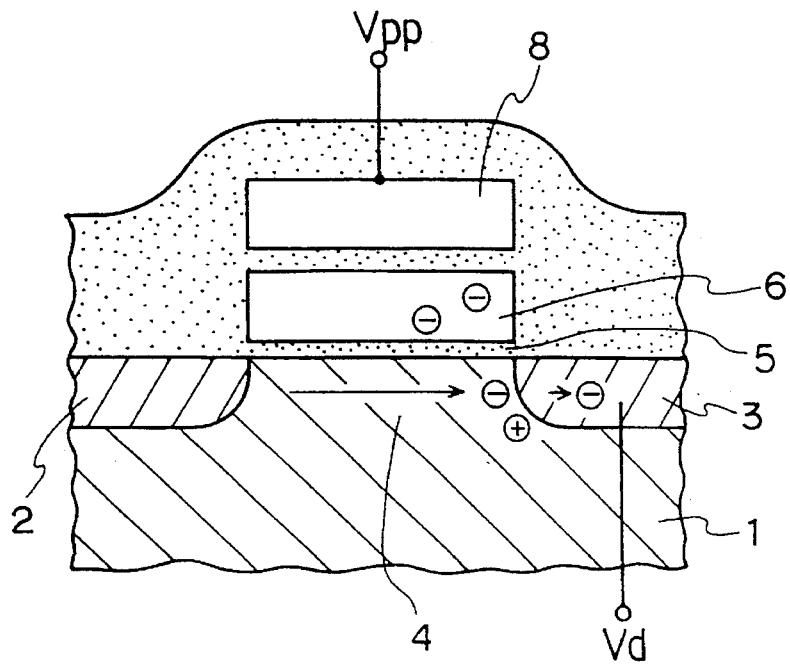
FIG. 7(a) is an explanatory view illustrating a write mode.
Figure 7B:
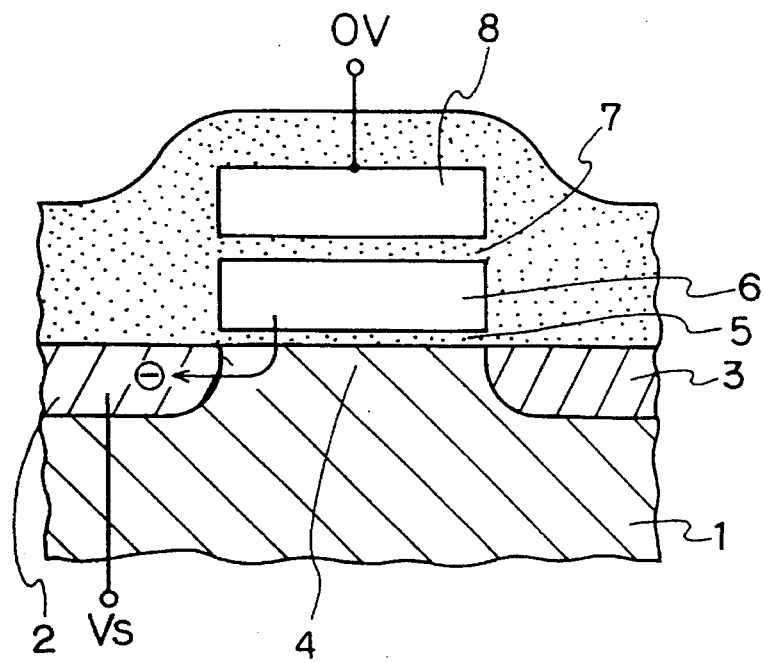
FIG. 7(b) is also an explanatory view illustrating an erase mode.

The virtual ground array semiconductor memory device of the present invention is constructed by arranging memory transistor cells of the type described above in a matrix as shown in FIG. 5, forming word lines $W_1, W_2 \ldots W_n$ to connect control gates of the cells in individual row, and forming bit lines $B_1, B_2 \ldots B_n$ to connect source (drain) regions of the cells in individual column.

A drive method (including erase mode, write mode and read mode) for this semiconductor memory device, especially for a selected cell $P_1$ of the cells arranged therein in a matrix will be explained.

In an erase mode of the drive method, a high voltage (about 18 V) is applied to the word line $W_2$ to which the selected cell P is connected, while a low voltage, 0 V or substantially 0 V, is applied to other word lines $W_1, W_3 \ldots W_n$, bit lines $B_1, B_2 \ldots B_n$ and the substrate. As a result electrons are injected by FN tunneling and, hence, the word lines are put in the erase mode one by one.

In writing to the memory transistor of the cell $P_1$, the word line $W_2$ is grounded with other word lines $W_1, W_3 \ldots W_n$ being applied with a write-prohibiting voltage $V_i$ (about 6 V). Further, a high voltage (about 12 V) is applied to the bit line $B_3$ on the drain side (adjacent to the floating gate of the cell $P_1$) of the cell $P_1$ with other bit lines $B_1, B_2, B_4 \ldots B_n$ being opened. The potential of the substrate is set to 0 V. Thus, the drain of the transistor of the cell $P_1$ has a potential higher than the control gate thereby to withdraw electrons from the floating gate toward the drain. This means that writing to the cell $P_1$ is accomplished. On the other hand, all the cells in other rows are applied with the write-prohibiting voltage $V_i$ through the associated word lines to decrease the potential against each drain, so that these cells are not written on. Further, in the cell existing adjacent to and on the right side of the cell $P_1$ in the same row, the control gate is also applied with a high voltage of 12 V through the source. However, since in this cell a portion of the control gate is provided on the side adjacent to the source, electrons will not be withdrawn from the floating gate thereof. In other cells in the same low with the cell $P_1$, current does not flow and, hence, writing is not performed since bit lines B, $B_2, B_4 \ldots B_n$ are opened. Thus, only cell $P_1$ is written and all other cells are not written.

In an alternative write mode, a negative potential ( about −6 V) is applied to the control gate (word line W) and a voltage of 6 V is applied to bit line Ba with other bit lines $B_1, B_2, B_4 \ldots B_n$ being opened. Thus, other word lines $W_1, W_3 \ldots W_n$ are each applied with a write-prohibiting voltage of 0 V. In this case, the source and the substrate are set to be a potential of 0 V, too.

In reading, for example, the cell $P_1$, a voltage (about 5 V) lower than the high voltage for writing is applied to word line $W_2$, while bit lines $B_2$ and $B_3$ are applied with 0 V and 1 V, respectively. At the same time, other bit lines $B_1, B_4 \ldots B_n$ are opened with other word lines $W_1, W_3 \ldots W_n$ and the substrate being set to be a potential of 0 V. In this state, only the cell $P_1$ is ready to permit current to flow since the potential of its drain is higher by 1 V than that of its source. Hence, the cell $P_1$ is turned ON or OFF depending on the relation between the voltage applied to the control gate and the threshold voltage determined by the electrons whether or not injected into the floating gate, thus allowing reading the state of "1" or "0".

Table 1 collectively shows how to apply potentials for erasing, writing and reading.

TABLE 1

|  | $B_1$ | $B_2$ | $B_3$ | $B_4$ | $W_1$ | $W_2$ | $W_1$ | Substrate |
|---|---|---|---|---|---|---|---|---|
| Erase mode | 0V | 0V | 0V | 0V | 0V | 18V | 0V | 0V |
| Write (1) | Open | Open | 12V | Open | 6V | 0V | 6V | 0V |
| mode (2) | Open | Open | 6V | Open | 0V | −6V | 0V | 0V |
| Read mode | Open | 0V | 1V | Open | 0V | 5V | 0V | 0V |

According to the present invention, as has been described, in a memory transistor having a floating gate which covers only a portion of the channel region, a portion of the control gate covers a portion of the channel region on either side of the source or the drain with intervention of the gate insulating film. Hence, in the virtual ground array semiconductor memory device of the present invention wherein memory transistors of such type are arranged in a matrix and the sources and the drains of adjacent memory transistors are connected, electrons can be withdrawn selectively from either floating gate of two adjacent cells. This allows erasing by injecting electrons to the floating gates and writing by withdrawing electrons therefrom and, hence, both the writing and the erasing can be achieved by using FN current. Since the memory device of the present invention is driven by using FN current, the efficiency of electron injection is almost 100% with little wasteful current thereby reducing the amount of electric power to be consumed. Accordingly, the use of this memory device in, for example, a personal computer driven by a battery makes it possible to significantly reduce the number of times of replacement or recharge of the battery. In addition the use of FN current to inject or withdraw electrons with no injection of hot electrons having a high energy makes it possible to have less deterioration of the tunnel insulating film and far more number of rewriting.

Further, in the arrangement of the present invention the portion of the channel region on which a portion of the control gate covers with intervention of the gate insulating film serves as a MOS transistor, which prevents the memory cell from malfunctioning due to too much withdrawal of electrons from the floating gate (i.e., giving a depletion-type transistor which responds to a low gate voltage).

Though several embodiments of the present invention are described above, it is to be understood that the present invention is not limited only to the above-mentioned, embodiment and various changes and modifications may be made in the invention without departing from the spirit and scope thereof.

What is claimed is:

1. A semiconductor memory device including a semiconductor substrate, and memory cells arranged in a matrix array on the semiconductor substrate, each of the memory cells comprising:

a drain region formed in the semiconductor substrate, the drain region comprising a high impurity concentration potion surrounded by a low impurity concentration portion, a source region formed in the semiconductor substrate, the source region comprising a high impurity concentration portion surrounded by a low impurity concentration portion, a channel region defined between the drain region and the source region, a tunnel insulating film formed on the channel region of the substrate, a floating gate formed only in the channel region and the low impurity concentration portion of the drain region on the tunnel insulating film, said floating gate having an end face aligned with an interface between said low impurity concentration portion and said high impurity concentration portion of said drain region, an interlayer insulating film formed on the floating gate, and a control gate formed on the interlayer insulating film, wherein the drain region of each memory cell is connected to or is in common with the source region of the adjacent memory cell;

the floating gate covers only a portion of the channel region; and the control gate is formed in a step shape such that a portion of the control gate covers either side of the channel region close to the drain or the source region with intervention of a gate insulating film while the remaining portion of the control gate covers the top and a lateral surface of the floating gate with intervention of the interlayer insulating film.

2. The semiconductor memory device of claim 1, wherein said insulating film has a multi-layered structure comprising silicon oxide and silicon nitride layers.

3. A method for driving the above-mentioned semiconductor memory device of claim 1, comprising the steps of:

(a) applying to the control gate an electric potential higher than that of the semiconductor substrate to inject electrons from the channel region to the floating gate in the erase mode; and (b) applying to either of the source region or the drain region on the side of the floating gate an electric potential higher than that of the control gate to withdraw electrons from the floating gate in the write mode.

* * * * *